(12) United States Patent
Kawano

(10) Patent No.: US 11,282,922 B2
(45) Date of Patent: Mar. 22, 2022

(54) SEMICONDUCTOR DEVICE

(71) Applicant: Mitsubishi Electric Corporation, Tokyo (JP)

(72) Inventor: Makoto Kawano, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/861,754

(22) Filed: Apr. 29, 2020

(65) Prior Publication Data
US 2021/0005713 A1    Jan. 7, 2021

(30) Foreign Application Priority Data

Jul. 2, 2019   (JP) .............................. JP2019-123484

(51) Int. Cl.
| | | |
|---|---|---|
| H01L 29/06 | (2006.01) | |
| H01L 29/73 | (2006.01) | |
| H01L 29/86 | (2006.01) | |
| H01L 29/66 | (2006.01) | |
| H01L 29/78 | (2006.01) | |
| H01L 29/423 | (2006.01) | |

(52) U.S. Cl.
CPC ...... H01L 29/0696 (2013.01); H01L 29/4236 (2013.01)

(58) Field of Classification Search
CPC . H01L 29/06; H01L 29/0619; H01L 29/0638; H01L 29/0696; H01L 29/42; H01L 29/423; H01L 29/4236; H01L 29/66; H01L 29/66734; H01L 29/73; H01L 29/7395; H01L 29/7397; H01L 29/78; H01L 29/7811; H01L 29/7813; H01L 29/86; H01L 29/8611

USPC .......................................................... 257/330
See application file for complete search history.

(56) References Cited

U.S. PATENT DOCUMENTS

| | | | |
|---|---|---|---|
| 6,339,228 B1* | 1/2002 | Iyer ........................ | G11C 29/50 257/301 |
| 7,499,354 B2* | 3/2009 | Houston ............ | G01R 31/3008 365/189.08 |
| 2007/0013000 A1* | 1/2007 | Shiraishi ............. | H01L 29/7813 257/341 |
| 2009/0189219 A1* | 7/2009 | Shinbori ............. | H01L 29/7804 257/334 |
| 2012/0013349 A1* | 1/2012 | Narazaki ................. | H01L 22/34 324/600 |
| 2016/0141402 A1* | 5/2016 | Hosokawa .......... | H01L 29/0615 257/144 |
| 2017/0111037 A1 | 4/2017 | Shiigi et al. | |
| 2018/0061980 A1* | 3/2018 | Ohoka .................. | H01L 27/085 |

FOREIGN PATENT DOCUMENTS

JP    2008306047 A    12/2008

* cited by examiner

*Primary Examiner* — Fazli Erdem
(74) *Attorney, Agent, or Firm* — Studebaker & Brackett PC

(57) ABSTRACT

In a first cell region of a semiconductor substrate, a first semiconductor element is formed. In a second cell region of semiconductor substrate, a second semiconductor element is formed. First semiconductor element includes a first electrode and a first p region. Second semiconductor element includes a second electrode and a second p region. First electrode and second electrode are separated from each other. First p region and second p region are separated from each other.

6 Claims, 14 Drawing Sheets

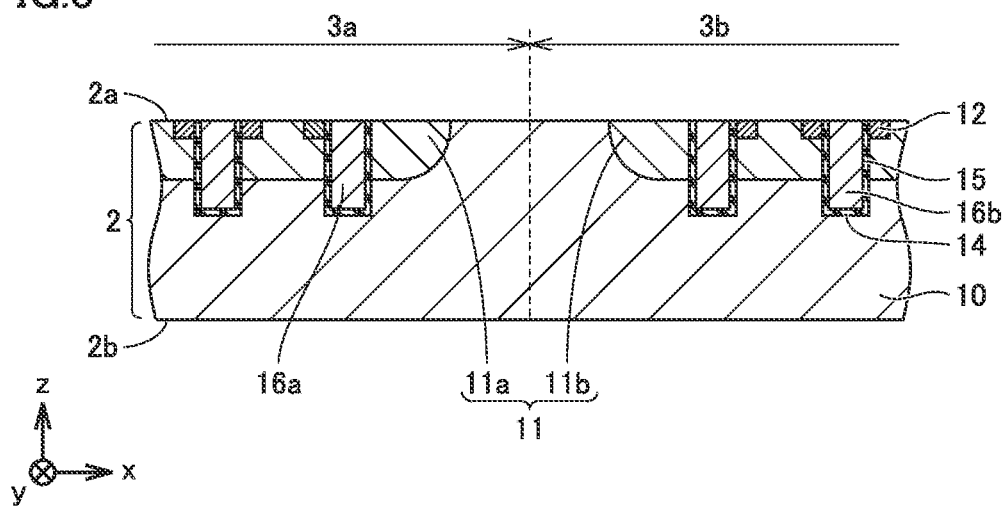
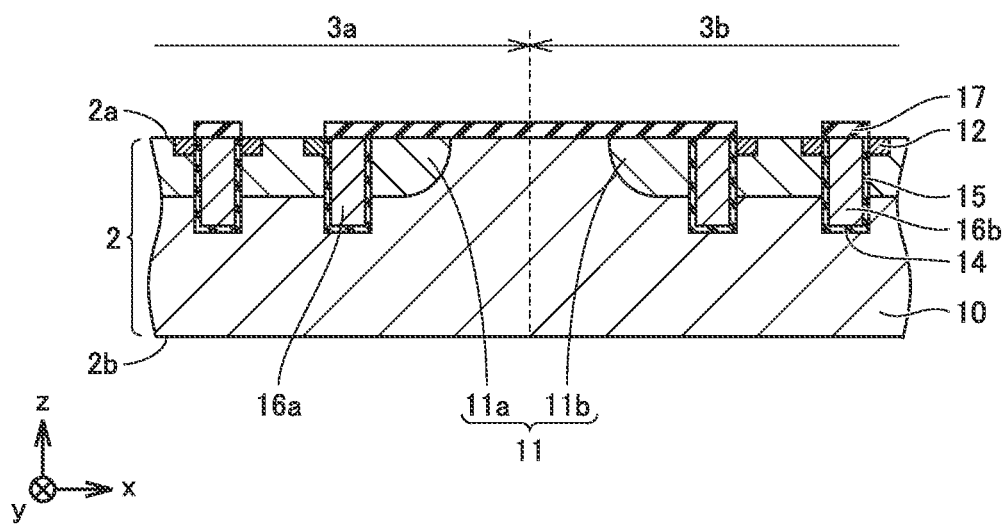

SEMICONDUCTOR DEVICE

BACKGROUND OF THE INVENTION

Field of the Invention

The present disclosure relates to a semiconductor device.

Description of the Background Art

Japanese Patent Laying-Open No. 2008-306047 discloses a semiconductor device having three separate FET structures. In the semiconductor device, an emitter electrode disposed on the front face of the semiconductor substrate is separated into three separate emitter electrodes in correspondence with the three separate FET structures. A probe is brought into contact with each of the three separate emitter electrodes, and respective characteristics of the three separate FET structures (for example, on-state resistance or on-state voltage of each separate FET structure) are measured.

SUMMARY OF THE INVENTION

In the semiconductor device disclosed in Japanese Patent Laying-Open No. 2008-306047, a drift layer and a body region extend continuously throughout the three separate FET structures. The drift layer and the body region are not separated among the three separate FET structures. There is sometimes the case that only one of the three separate FET structures contains a defect, and a leak current is generated from the defect. The leak current spreads throughout the drift layer and the body region extending over the three separate FET structures. The leak current flows not only into the one separate FET structure containing the defect, but also into the remaining two separate FET structures not containing the defect. The leak current to be measured in the one separate FET structure containing the defect reduces. The accuracy of measurement of characteristics for the separate FET structure having the defect deteriorates.

The present disclosure has been made in light of the aforementioned problem, and it is an object of the present disclosure to provide a semiconductor device for which respective characteristics of a plurality of cell regions are measured with high accuracy.

A semiconductor device of the present disclosure includes a semiconductor substrate, a front electrode, and a back electrode. The semiconductor substrate has a front face, and a back face. The front electrode is disposed on the front face of the semiconductor substrate. The back electrode is disposed on the back face of the semiconductor substrate. The semiconductor substrate includes a first cell region, and a second cell region adjacent to the first cell region. In the first cell region, a first semiconductor element is formed. In the second cell region, a second semiconductor element is formed. The front electrode includes a first electrode formed in the first cell region, and a second electrode formed in the second cell region. The first semiconductor element includes the first electrode, and a first p region formed on a side of the front face of the first cell region. The second semiconductor element includes the second electrode, and a second p region formed on a side of the front face of the second cell region. The first electrode and the second electrode are separated from each other. The first p region of the first semiconductor element and the second p region of the second semiconductor element are separated from each other.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 8 is a schematic partially enlarged section view showing a step next to the step shown in FIG. 7 in the production method of the semiconductor device according to the first embodiment.

FIG. 9 is a schematic partially enlarged section view showing a step next to the step shown in FIG. 8 in the production method of the semiconductor device according to the first embodiment.

DESCRIPTION OF THE PREFERRED EMBODIMENTS

Figure 1:
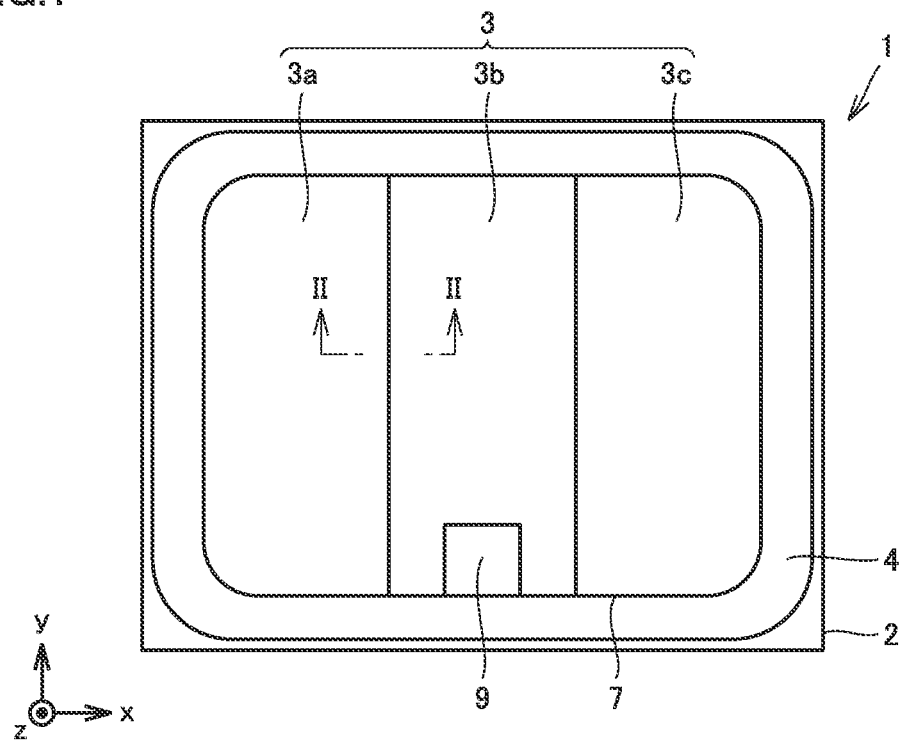
FIG. 1 is a schematic plan view of a semiconductor device according to a first embodiment.

Hereinafter, embodiments of the present disclosure are described. The same constitution is denoted by the same reference numeral, and the description of the constitution is not repeated.

First Embodiment

Figure 2:
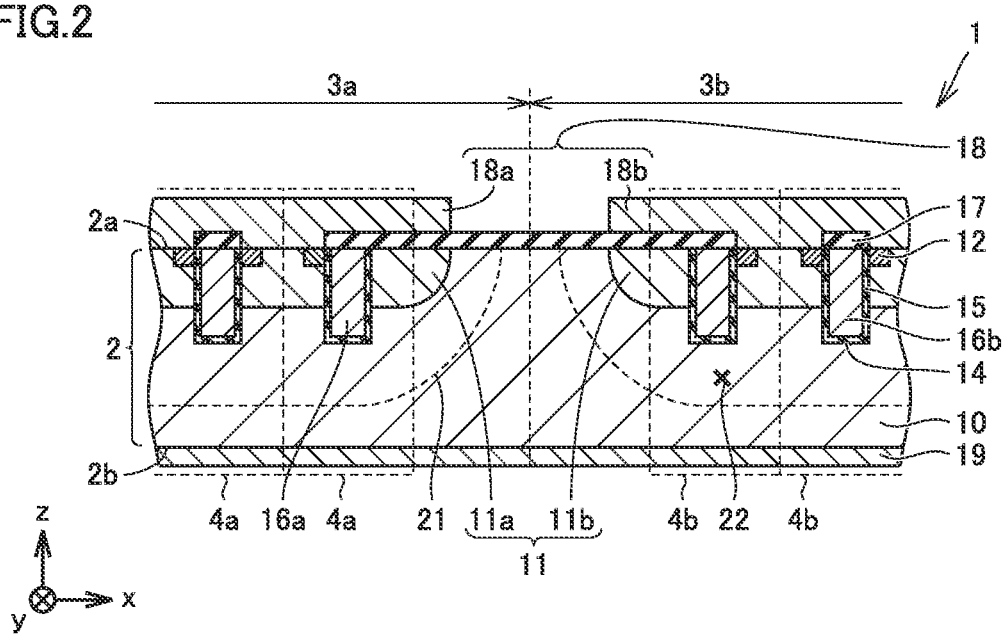
FIG. 2 is a schematic partially enlarged section view along section line II-II shown in FIG. 1 of the semiconductor device according to the first embodiment.

Referring to FIGS. 1 and 2, a semiconductor device 1 of the present embodiment is described. Semiconductor device 1 is, for example, a power semiconductor device. Semiconductor device 1 mainly includes a semiconductor substrate 2, a front electrode 18, and a back electrode 19.

Semiconductor substrate 2 has a front face 2a, and a back face 2b on a side opposite to front face 2a. Semiconductor substrate 2 is, for example, a silicon substrate or a silicon carbide substrate. As shown in FIG. 1, in plan view of front face 2a of semiconductor substrate 2, semiconductor substrate 2 includes an element region 3, and a peripheral region 4 surrounding element region 3.

Element region 3 includes a plurality of cell regions. Specifically, element region 3 includes a first cell region 3a, and a second cell region 3b adjacent to first cell region 3a. Element region 3 may further include a third cell region 3c adjacent to second cell region 3b. As shown in FIG. 1, in plan view of front face 2a of semiconductor substrate 2, first cell region 3a, second cell region 3b, and third cell region 3c are arranged in a first direction (x direction). Third cell region 3c is formed line-symmetrically with first cell region 3a with respect to second cell region 3b. Third cell region 3c has the same configuration as first cell region 3a. Hereinafter, mainly, structures of first cell region 3a and second cell region 3b are specifically described.

As shown in FIG. 2, a first semiconductor element 4a is formed in first cell region 3a. In second cell region 3b, a second semiconductor element 4b is formed. In third cell region 3c, at least one third semiconductor element 4c (see FIG. 10) is formed. First semiconductor element 4a, second semiconductor element 4b, and third semiconductor element 4c are, for example, power semiconductor elements. First semiconductor element 4a, second semiconductor element 4b, and third semiconductor element 4c are, for example, transistors having trench gate structure. Specifically, first semiconductor element 4a, second semiconductor element 4b, and third semiconductor element 4c are, for example, metal oxide semiconductor field effect transistors (MOSFET) having trench gate structure. First semiconductor element 4a, second semiconductor element 4b, and third semiconductor element 4c may be, for example, insulated gate bipolar transistors (IGBT) having trench gate structure.

Front electrode 18 is disposed on front face 2a of semiconductor substrate 2. Front electrode 18 is formed, for example, of a conductive material such as AlSi. Front electrode 18 includes a first electrode 18a formed in first cell region 3a, and a second electrode 18b formed in second cell region 3b. First electrode 18a and second electrode 18b are separated from each other at the boundary between first cell region 3a and second cell region 3b.

Back electrode 19 is disposed on back face 2b of semiconductor substrate 2. Back electrode 19 is formed, for example, of a conductive material such as Ni. Back electrode 19 is formed continuously throughout a plurality of cell regions (for example, first cell region 3a and second cell region 3b). Back electrode 19 is not separated among the plurality of cell regions.

As shown in FIG. 2, semiconductor substrate 2 includes an n⁻ region 10, a first p region 11a, and a second p region 11b. First semiconductor element 4a includes first electrode 18a, n⁻ region 10, first p region 11a, and back electrode 19. When first semiconductor element 4a is a transistor having trench gate structure, first semiconductor element 4a further includes an n⁺ source region 12, a gate insulating film 15, and a first gate electrode 16a.

Second semiconductor element 4b includes second electrode 18b, n⁻ region 10, second p region 11b, and back electrode 19. When second semiconductor element 4b is a transistor having trench gate structure, second semiconductor element 4b further includes n⁺ source region 12, gate insulating film 15, and a second gate electrode 16b.

N⁻ region 10 is formed continuously throughout a plurality of cell regions (for example, first cell region 3a and second cell region 3b).

N⁻ region 10 is not separated among the plurality of cell regions.

When first semiconductor element 4a and second semiconductor element 4b are transistors having trench gate structure, n⁻ region 10 functions, for example, as a drift region.

First p region 11a is formed in first cell region 3a. Second p region 11b is formed in second cell region 3b. First p region 11a and second p region 11b are disposed on a side of front face 2a of semiconductor substrate 2 with respect to n⁻ region 10. First p region 11a and second p region 11b are in contact with n⁻ region 10. First p region 11a and second p region 11b are separated from each other at the boundary between first cell region 3a and second cell region 3b. When first semiconductor element 4a and second semiconductor element 4b are transistors having trench gate structure, first p region 11a and second p region 11b function, for example, as a p base region 11.

N⁺ source region 12 is formed on part of front face 2a of semiconductor substrate 2. N⁺ source region 12 formed in first cell region 3a is in contact with first electrode 18a and first p region 11a. N⁺ source region 12 formed in second cell region 3b is in contact with second electrode 18b and second p region 11b. N⁺ source region 12 is separated from n⁻ region 10 by p base region 11 (for example, first p region 11a and second p region 11b). N⁺ source region 12 has a smaller thickness than p base region 11. N+ source region 12 has higher n-type impurity concentration than n− region 10.

Gate insulating film 15 is disposed at least on a part of p base region 11 (for example, first p region 11a and second p region 11b) between n+ source region 12 and n− region 10. A channel is formed in the part of p base region 11 during ON operation of the semiconductor element (first semiconductor element 4a, second semiconductor element 4b). When first semiconductor element 4a and second semiconductor element 4b are transistors having trench gate structure, semiconductor substrate 2 is provided with a trench 14 that penetrates n+ source region 12 and p base region 11 to reach n− region 10. Gate insulating film 15 is formed on lateral walls and a bottom face of trench 14. Gate insulating film 15 is, for example, a $SiO_2$ film.

First gate electrode 16a faces with the part of p base region 11 (first p region 11a) with gate insulating film 15 interposed therebetween. Second gate electrode 16b faces with the part of p base region 11 (second p region 11b) with gate insulating film 15 interposed therebetween. First gate electrode 16a and second gate electrode 16b extend, for example, along a second direction (y direction) that is perpendicular to the first direction (x direction). When first semiconductor element 4a and second semiconductor element 4b are transistors having trench gate structure, first gate electrode 16a and second gate electrode 16b are trench gate electrodes provided in trench 14.

First semiconductor element 4a includes first electrode 18a. When first semiconductor element 4a is a transistor having trench gate structure, first electrode 18a functions as a first source electrode. First electrode 18a is electrically connected with n+ source region 12 of first semiconductor element 4a. Second semiconductor element 4b includes second electrode 18b. When second semiconductor element 4b is a transistor having trench gate structure, second electrode 18b functions as a second source electrode. Second electrode 18b is electrically connected with n+ source region 12 of second semiconductor element 4b.

First electrode 18a and second electrode 18b are electrically insulated from first gate electrode 16a and second gate electrode 16b by an interlayer insulating film 17. Interlayer insulating film 17 covers first gate electrode 16a, second gate electrode 16b, and gate insulating film 15. Interlayer insulating film 17 is, for example, a $SiO_2$ film.

When first semiconductor element 4a and second semiconductor element 4b are transistors having trench gate structure, back electrode 19 functions as a drain electrode. Back electrode 19 may come into contact with, for example, n− region 10.

As shown in FIG. 1, gate wiring 7 and a gate pad 9 are disposed on front face 2a of semiconductor substrate 2. Gate wiring 7 extends along the boundary between element region 3 and peripheral region 4 of semiconductor substrate 2. Gate wiring 7 is formed, for example, of a conductive material such as AlSi. Gate wiring 7 is electrically connected with first gate electrode 16a of first semiconductor element 4a, and second gate electrode 16b of second semiconductor element 4b. Gate wiring 7 is connected with gate pad 9. To gate pad 9, a conductive wire (not shown) is bonded.

In peripheral region 4, for example, electric field limiting ring structure (not shown) may be formed. The electric field limiting ring structure increases the resisting pressure of semiconductor device 1.

Figure 3:
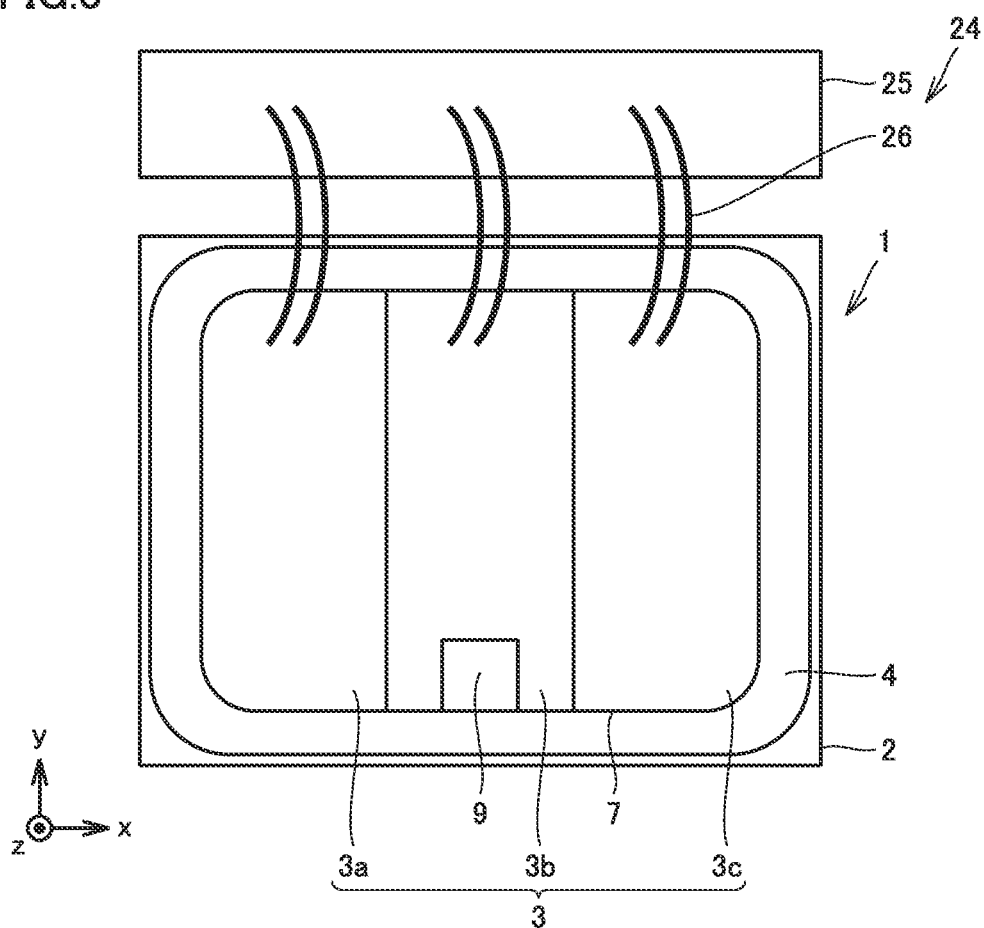
FIG. 3 is a schematic plan view showing a semiconductor module which is one application example of the semiconductor device according to the first embodiment.

Referring to FIG. 3, a semiconductor module 24 which is one application example of semiconductor device 1 according to the present embodiment is described. Semiconductor module 24 may be, for example, a power semiconductor module. Semiconductor module 24 includes semiconductor device 1, a metal frame 25, and a conductive wire 26. First cell region 3a, second cell region 3b, and third cell region 3c of semiconductor device 1 are connected with metal frame 25 by means of conductive wire 26. First cell region 3a, second cell region 3b, and third cell region 3c uniformly operate.

Referring to FIG. 1, and FIGS. 4 to 9, one example of a production method of semiconductor device 1 is described.

Figure 4:
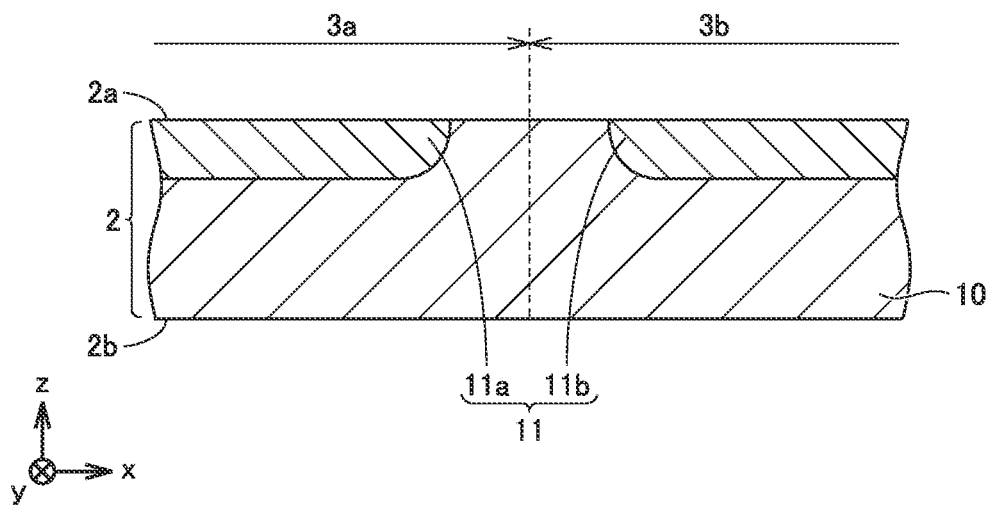
FIG. 4 is a schematic partially enlarged section view showing one step of a production method of the semiconductor device according to the first embodiment.
Figure 5:
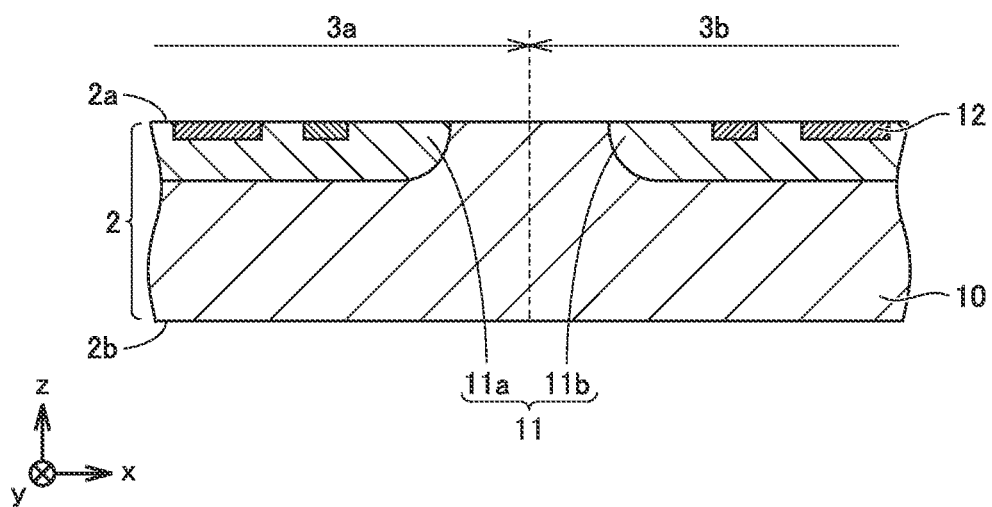
FIG. 5 is a schematic partially enlarged section view showing a step next to the step shown in FIG. 4 in the production method of the semiconductor device according to the first embodiment.
Figure 6:
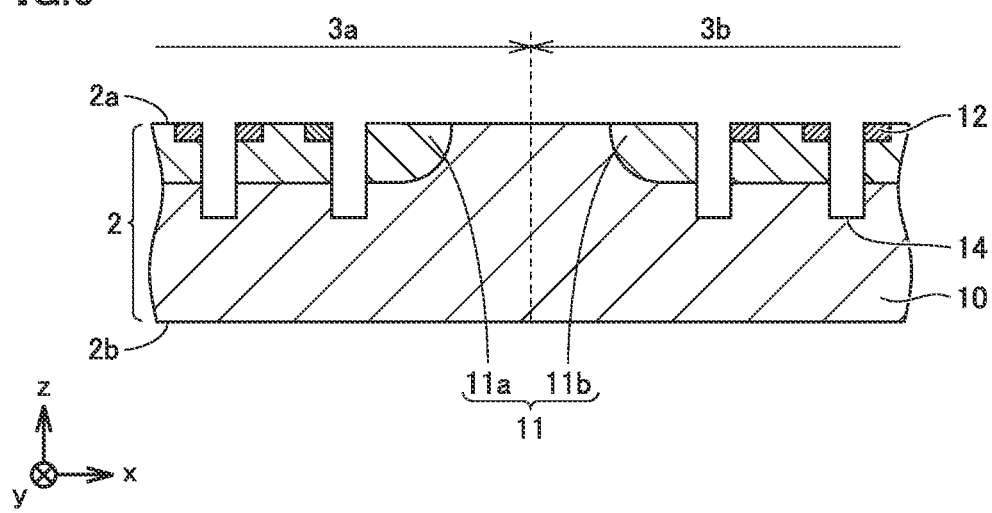
FIG. 6 is a schematic partially enlarged section view showing a step next to the step shown in FIG. 5 in the production method of the semiconductor device according to the first embodiment.
Figure 7:
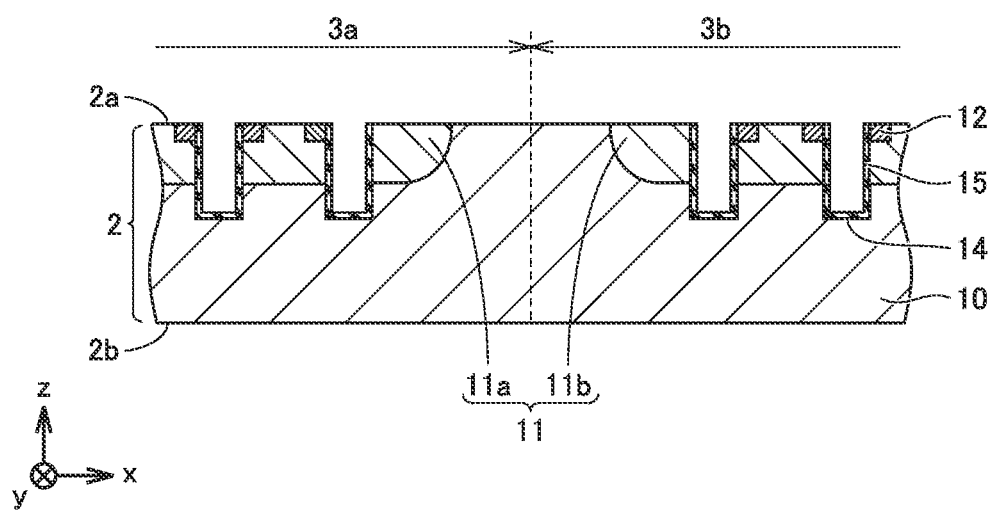
FIG. 7 is a schematic partially enlarged section view showing a step next to the step shown in FIG. 6 in the production method of the semiconductor device according to the first embodiment.

As shown in FIG. 4, p-type impurities are doped from front face 2a of n-type semiconductor substrate 2, to form first p region 11a and second p region 11b. First p region 11a and second p region 11b are separated from each other at the boundary between first cell region 3a and second cell region 3b. In semiconductor substrate 2, the part where first p region 11a and second p region 11b are not formed is n− region 10. As shown in FIG. 5, n-type impurities are doped from front face 2a of semiconductor substrate 2, to form n+ source region 12 in first p region 11a and second p region 11b. As shown in FIG. 6, part of front face 2a of semiconductor substrate 2 is etched to form trench 14. As shown in FIG. 7, the surface of trench 14 of semiconductor substrate 2 is oxidized to form gate insulating film 15 on the bottom face and lateral faces of trench 14.

As shown in FIG. 8, on gate insulating film 15 in trench 14, first gate electrode 16a and second gate electrode 16b are formed. For example, a gate electrode film (not shown) is formed on gate insulating film 15 and on front face 2a of semiconductor substrate 2. The gate electrode film on front face 2a of semiconductor substrate 2 is etched back. In this manner, first gate electrode 16a and second gate electrode 16b are formed in trench 14. As shown in FIG. 9, on part of front face 2a of semiconductor substrate 2, and on first gate electrode 16a and second gate electrode 16b, interlayer insulating film 17 is formed. Front electrode 18 (first electrode 18a and second electrode 18b) is formed on front face 2a of semiconductor substrate 2. First electrode 18a and second electrode 18b are separated from each other at the boundary between first cell region 3a and second cell region 3b. On back face 2b of semiconductor substrate 2, back electrode 19 is formed. In this manner, semiconductor device 1 shown in FIG. 1 is obtained.

Figure 10:
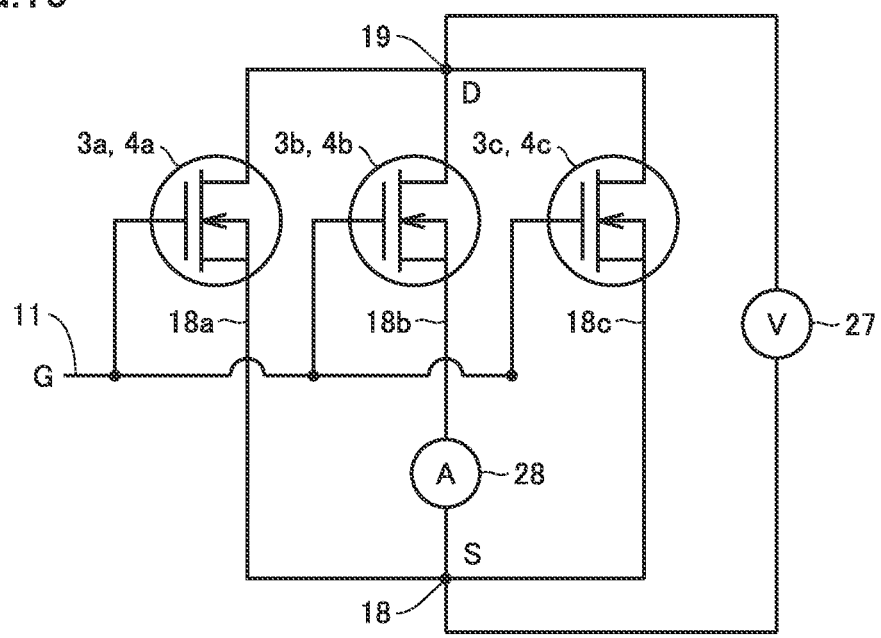
FIG. 10 is a diagram showing a circuit that measures respective characteristics of a plurality of cell regions of the semiconductor device according to the first embodiment.

Referring to FIGS. 1 and 10, operation of semiconductor device 1 is described.

In semiconductor device 1, it is assumed that only one of a plurality of cell regions (for example, second cell region 3b) contains a defect 22, and the remainder of the plurality of cell regions (for example, first cell region 3a, third cell region 3c) do not contain defect 22. Using a circuit shown in FIG. 10, respective characteristics of the plurality of cell regions (for example, first cell region 3a, second cell region 3b, third cell region 3c) of semiconductor device 1 are measured. For example, front electrode 18 and back electrode 19 are connected with a power source 27, and voltage is applied between front electrode 18 and back electrode 19. An ammeter 28 is connected with only one of the plurality of cell regions (for example, second cell region 3b (second electrode 18b of second semiconductor element 4b)), and a leak current generated in one of the plurality of cell regions (for example, second cell region 3b) is measured. In this manner, characteristics of one of the plurality of cell regions are measured.

When voltage is applied between front electrode 18 and back electrode 19, reverse bias voltage is applied to pn junction formed by n− region 10 and p base region 11 (for example, first p region 11a and second p region 11b). A depletion region 21 spreads to n− region 10. The carriers generated caused by defect 22 are accelerated by the electric field in depletion region 21, and a leak current is generated in second cell region 3b.

In semiconductor device 1, p base regions 11 (for example, first p region 11a and second p region 11b) are separated among the plurality of cell regions (for example, first cell region 3a, second cell region 3b, and third cell region 3c). Therefore, it is possible to control overlapping of depletion regions 21 spread from adjacent cell regions. Between the plurality of cell regions, front electrodes 18 (for example, first electrode 18a, second electrode 18b, and a third electrode 18c) are separated from each other. Therefore, the leak current generated in one of the plurality of cell regions (for example, second cell region 3b) is suppressed from flowing into the remainder of the plurality of cell regions (for example, first cell region 3a, third cell region 3c). The leak current measured by ammeter 28 connected with one of the plurality of cell regions (second cell region 3b (second electrode 18b of second semiconductor element 4b)) increases. In semiconductor device 1, respective characteristics of the plurality of cell regions can be measured with high accuracy.

An effect of semiconductor device 1 of the present embodiment is described.

Semiconductor device 1 according to the present embodiment includes semiconductor substrate 2, front electrode 18, and back electrode 19. Semiconductor substrate 2 has front face 2a and back face 2b. Front electrode 18 is disposed on front face 2a of semiconductor substrate 2. Back electrode 19 is disposed on back face 2b of semiconductor substrate 2. Semiconductor substrate 2 includes first cell region 3a, and second cell region 3b adjacent to first cell region 3a. In first cell region 3a, first semiconductor element 4a is formed. In second cell region 3b, a second semiconductor element 4b is formed. Front electrode 18 includes a first electrode 18a formed in first cell region 3a, and a second electrode 18b formed in second cell region 3b. First semiconductor element 4a includes first electrode 18a, and first p region 11a formed on the side of front face 2a of first cell region 3a. Second semiconductor element 4b includes second electrode 18b, and second p region 11b formed on the side of front face 2a of second cell region 3b. First electrode 18a and second electrode 18b are separated from each other. First p region 11a of first semiconductor element 4a and second p region 11b of second semiconductor element 4b are separated from each other.

Therefore, the leak current generated in one of the plurality of cell regions (for example, second cell region 3b) is suppressed from flowing into the remainder of the plurality of cell regions (for example, first cell region 3a). In semiconductor device 1, respective characteristics of the plurality of cell regions can be measured with high accuracy.

Second Embodiment

Figure 11:
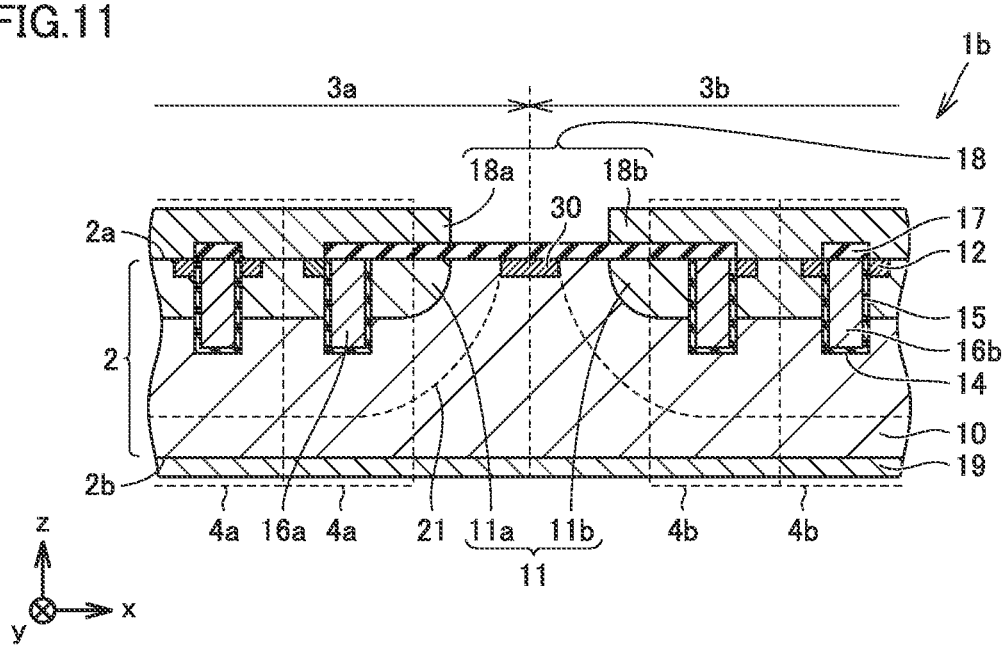
FIG. 11 is a schematic partially enlarged section view of a semiconductor device according to a second embodiment.

Referring to FIG. 11, a semiconductor device 1b of a second embodiment is described. Semiconductor device 1b of the present embodiment has the same configuration as semiconductor device 1 of the first embodiment, but differs from semiconductor device 1 in the following points.

Semiconductor substrate 2 further includes an $n^+$ region 30. $N^+$ region 30 has higher n-type impurity concentration than $n^+$ region 10. Without limiting the disclosure, $n^+$ region 30 may have the same n-type impurity concentration as $n^+$ source region 12. Without limiting the disclosure, $n^+$ region 30 may have a smaller thickness than p base region 11 (for example, first p region 11a and second p region 11b). $N^+$ region 30 may be formed inn region 10.

$N^+$ region 30 is disposed at the boundary between first cell region 3a and second cell region 3b in plan view of front face 2a of semiconductor substrate 2. $N^+$ region 30 is disposed between first p region 11a of first semiconductor element 4a, and second p region 11b of second semiconductor element 4b in plan view of front face 2a of semiconductor substrate 2. $N^+$ region 30 may be disposed in the center of the gap between first p region 11a and second p region 11b. $N^+$ region 30 is separated from first p region 11a and second p region 11b. Likewise, $n^+$ region 30 may further be disposed at the boundary between second cell region 3b and third cell region 3c in plan view of front face 2a of semiconductor substrate 2.

Operation of semiconductor device 1b is described.

When voltage is applied between front electrode 18 and back electrode 19 so as to measure characteristics of semiconductor device 1b, depletion regions 21 spread from adjacent cell regions (for example, first cell region 3a and second cell region 3b). If depletion regions 21 that are spread from adjacent cell regions (for example, first cell region 3a and second cell region 3b) overlap with each other, a leak current generated in one of the plurality of cell regions (for example, second cell region 3b) flows into the remainder of the plurality of cell regions (for example, first cell region 3a).

$N^+$ region 30 prevents depletion regions 21 spread from adjacent cell regions (for example, first cell region 3a and second cell region 3b) from overlapping with each other. $N^+$ region 30 prevents the leak current generated in one of the plurality of cell regions (for example, second cell region 3b) from flowing into the remainder of the plurality of cell regions (for example, first cell region 3a) more securely. Thus, in semiconductor device 1b, respective characteristics of the plurality of cell regions can be measured with higher accuracy.

Figure 12:
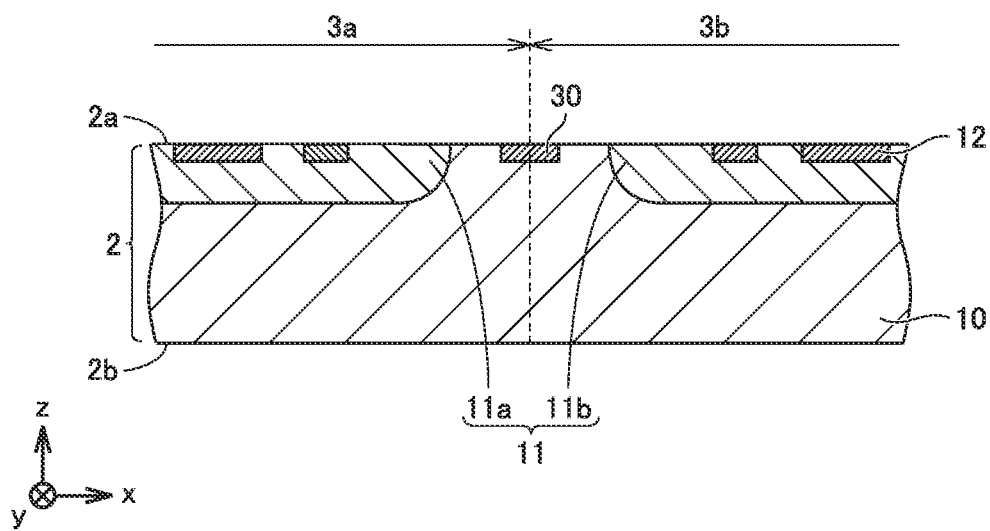
FIG. 12 is a schematic partially enlarged section view showing one step of a production method of the semiconductor device according to the second embodiment.

Referring to FIG. 12, one example of a production method of semiconductor device 1b of the second embodiment is described. While the production method of semiconductor device 1b of the present embodiment includes the same steps as those in the production method of semiconductor device 1 of the first embodiment, but differs from the production method of semiconductor device 1 in the following points. In the production method of semiconductor device 1b of the present embodiment, $n^+$ region 30 is also formed in forming $n^+$ source region 12.

Semiconductor device 1b of the present embodiment exerts the following effect in addition to the effect of semiconductor device 1 of the first embodiment.

In semiconductor device 1b of the present embodiment, semiconductor substrate 2 further includes $n^+$ region 30 disposed between first p region 11a of first semiconductor element 4a, and second p region 11b of second semiconductor element 4b in plan view of front face 2a of semiconductor substrate 2. $N^+$ region 30 is separated from first p region 11a and second p region 11b.

$N^+$ region 30 prevents depletion regions 21 spread from adjacent cell regions (for example, first cell region 3a and second cell region 3b) from overlapping with each other. $N^+$ region 30 prevents the leak current generated in one of the plurality of cell regions (for example, second cell region 3b) from flowing into the remainder of the plurality of cell regions (for example, first cell region 3a) more securely. Thus, in semiconductor device 1b, respective characteristics of the plurality of cell regions can be measured with higher accuracy.

Third Embodiment

Referring to FIGS. 13 to 16, a semiconductor device 1c of a third embodiment is described. Semiconductor device 1c of the present embodiment has the same configuration as semiconductor device 1 of the first embodiment, but differs from semiconductor device 1 in the following points.

Figure 13:
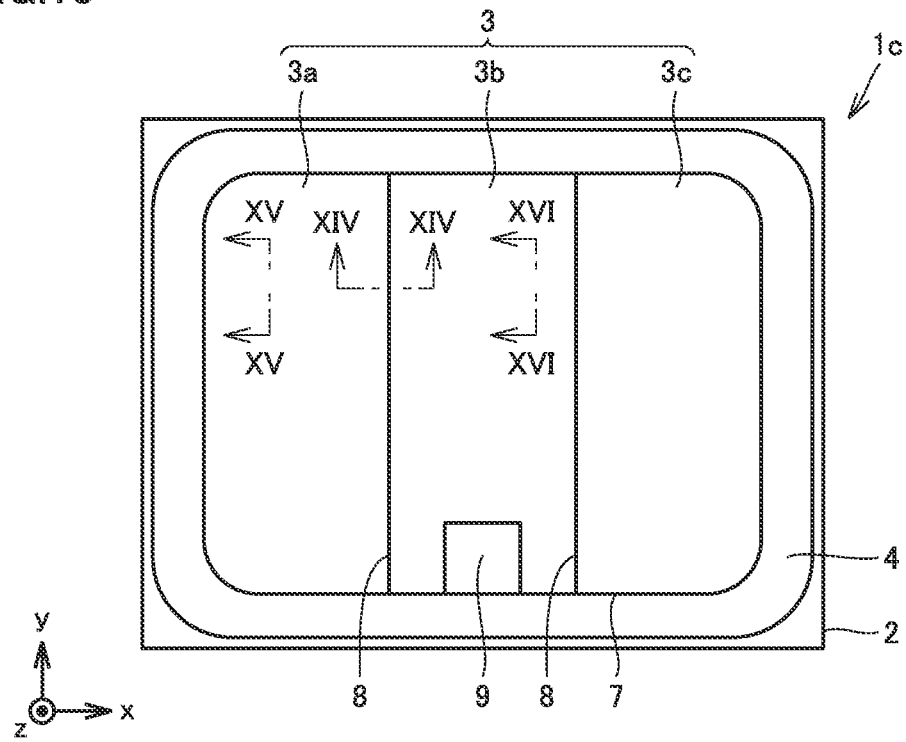
FIG. 13 is a schematic plan view of a semiconductor device according to a third embodiment.
Figure 14:
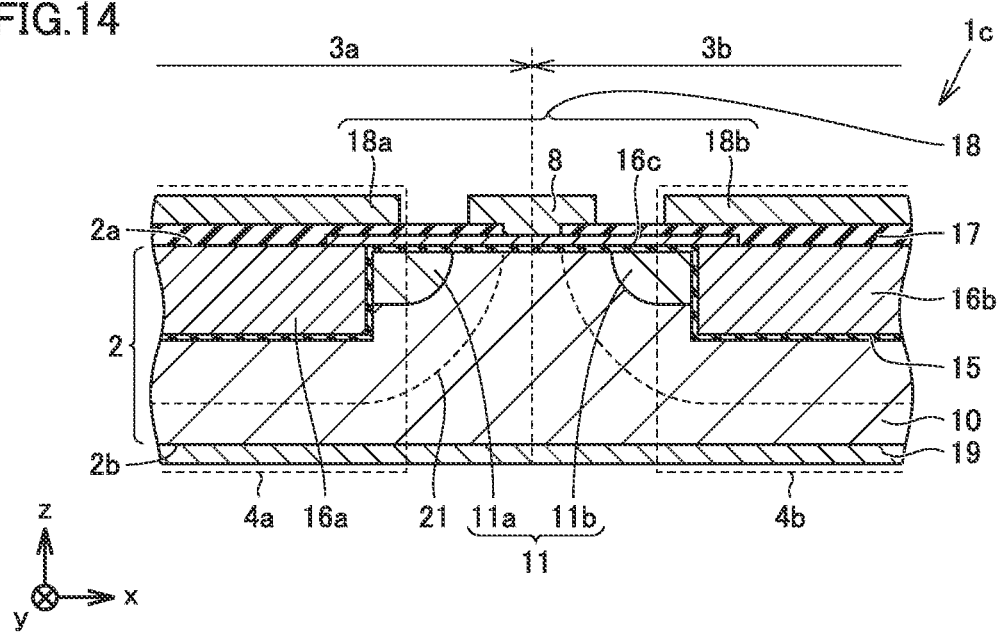
FIG. 14 is a schematic partially enlarged section view along section line XIV-XIV shown in FIG. 13 of the semiconductor device according to the third embodiment.
Figure 15:
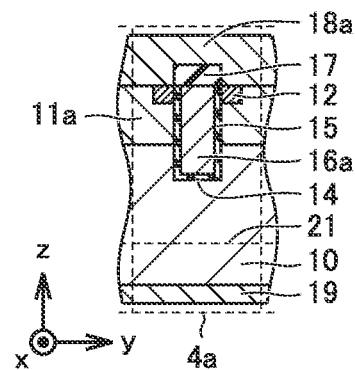
FIG. 15 is a schematic partially enlarged section view along section line XV-XV shown in FIG. 13 of the semiconductor device according to the third embodiment.
Figure 16:
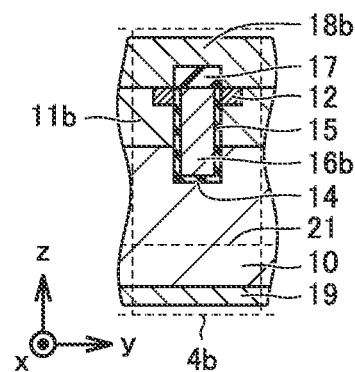
FIG. 16 is a schematic partially enlarged section view along section line XVI-XVI shown in FIG. 13 of the semiconductor device according to the third embodiment.

First gate electrode 16a and second gate electrode 16b extend, for example, along the first direction (x direction). As shown in FIGS. 13 and 14, semiconductor device 1c further includes gate wiring 8. Gate wiring 8 is disposed on front face 2a of semiconductor substrate 2. Gate wiring 8 extends along the second direction (y direction) that is perpendicular to the first direction (x direction). Gate wiring 8 is connected with gate wiring 7. Gate wiring 8 is electrically connected with gate pad 9 via gate wiring 7. Gate wiring 8 is formed, for example, of a conductive material such as AlSi. Gate wiring 8 is electrically insulated from $n^-$ region 10 by interlayer insulating film 17.

Gate wiring 8 is disposed on the boundary between adjacent cell regions (for example, first cell region 3a and second cell region 3b) in plan view of front face 2a of semiconductor substrate 2. Gate wiring 8 extends along the boundary between adjacent cell regions. For example, gate wiring 8 is disposed on the boundary between first cell region 3a and second cell region 3b. Gate wiring 8 extends along the boundary between first cell region 3a and second cell region 3b. Gate wiring 8 is disposed between first electrode 18a and second electrode 18b. In plan view of front face 2a of semiconductor substrate 2, gate wiring 8 may be disposed between first p region 11a of first semiconductor element 4a, and second p region 11b of second semiconductor element 4b.

Gate wiring 8 is electrically connected with a plurality of gate electrodes (for example, first gate electrode 16a and second gate electrode 16b) of a plurality of semiconductor elements (for example, first semiconductor element 4a and second semiconductor element 4b). Specifically, as shown in FIG. 14, gate electrodes (for example, first gate electrode 16a and second gate electrode 16b) of adjacent semiconductor elements (for example, first semiconductor element 4a and second semiconductor element 4b) are connected with gate wiring 8 via gate connecting wiring 8c. Gate connecting wiring 8c is formed, for example, of a conductive material such as AlSi. Gate connecting wiring 8c is electrically insulated by interlayer insulating film 17, from front electrode 18 (for example, first electrode 18a and second electrode 18b), p base region 11 (for example, first p region 11a and second p region 11b), and $n^-$ region 10.

Semiconductor device 1c of the present embodiment exerts the following effect in addition to the effect of semiconductor device 1 of the first embodiment.

Semiconductor device 1c of the present embodiment further includes gate wiring 8 that is electrically connected with first gate electrode 16a of first semiconductor element 4a, and second gate electrode 16b of second semiconductor element 4b. In plan view of front face 2a of semiconductor substrate 2, gate wiring 8 is disposed on the boundary between first cell region 3a and second cell region 3b.

The boundary between first cell region 3a and second cell region 3b is an invalid region of semiconductor substrate 2. Gate wiring 8 is arranged in the invalid region of semiconductor substrate 2. Therefore, it is possible to increase at least one of the area and the number of the plurality of cell regions included in semiconductor device 1c. It is possible to increase the number of semiconductor elements included in each of the plurality of cell regions in semiconductor device 1c. It is possible to improve the performance of semiconductor device 1c.

Fourth Embodiment

Figure 17:
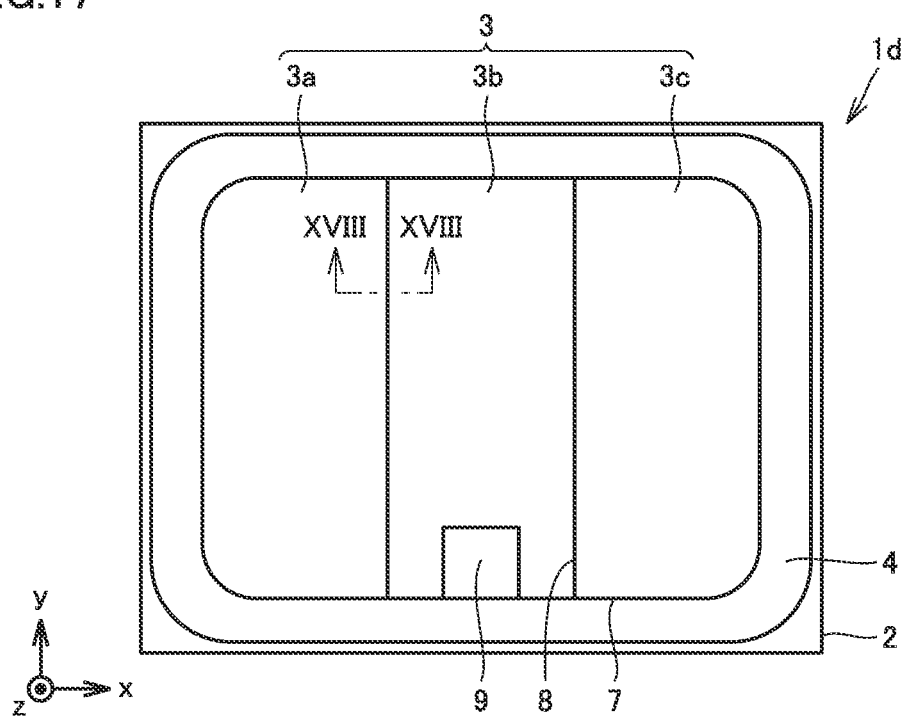
FIG. 17 is a schematic plan view of a semiconductor device according to a fourth embodiment.
Figure 18:
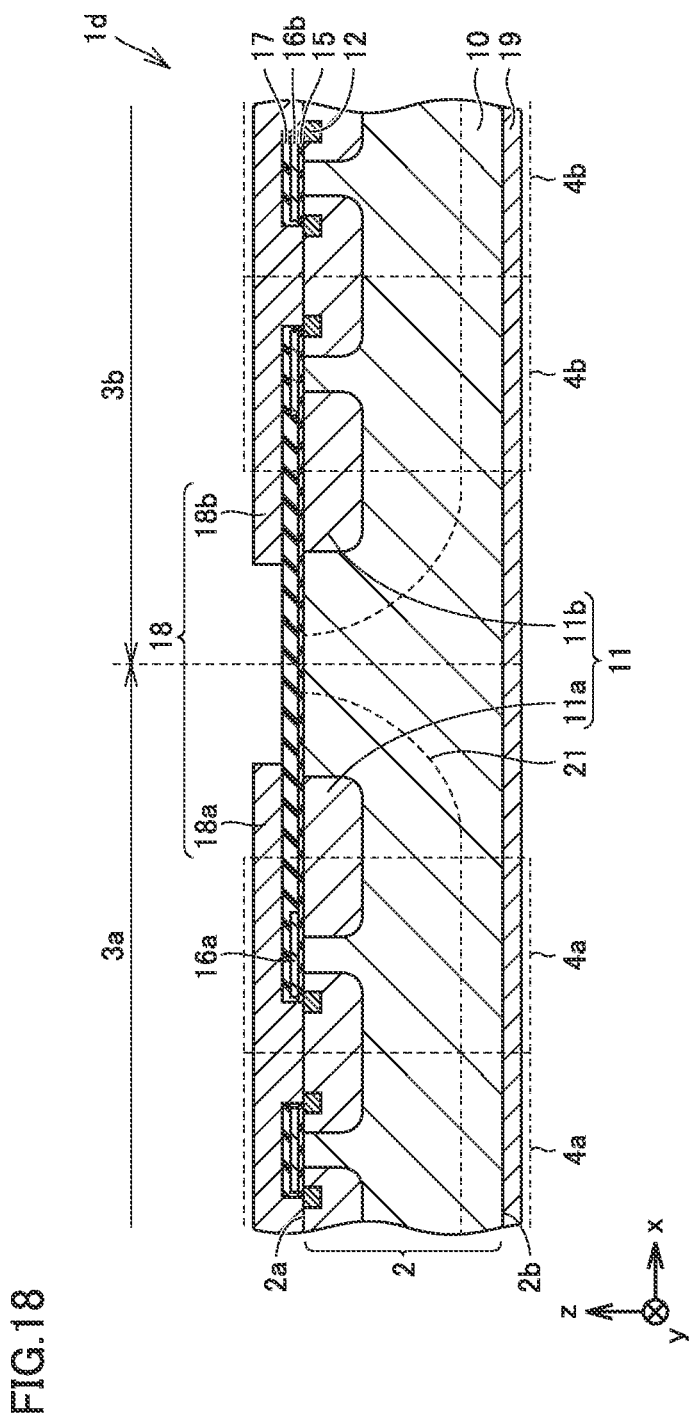
FIG. 18 is a schematic partially enlarged section view along section line XVIII-XVIII shown in FIG. 17 of the semiconductor device according to the fourth embodiment.
Figure 19:
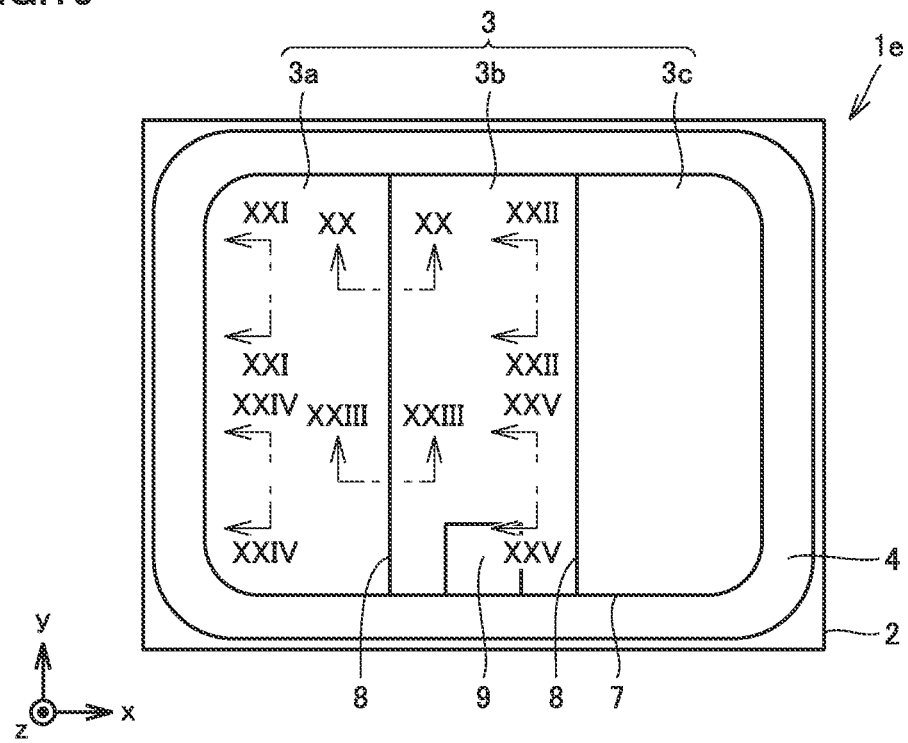
FIG. 19 is a schematic plan view of a semiconductor device according to a fifth embodiment.
Figure 20:
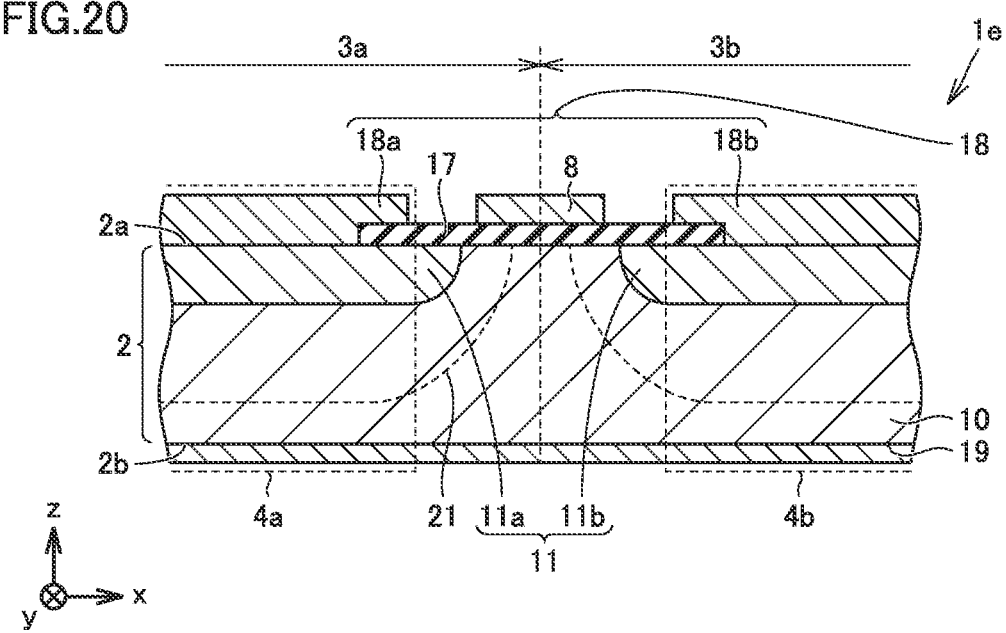
FIG. 20 is a schematic partially enlarged section view along section line XX-XX shown in FIG. 19 of the semiconductor device according to the fifth embodiment.
Figure 21:
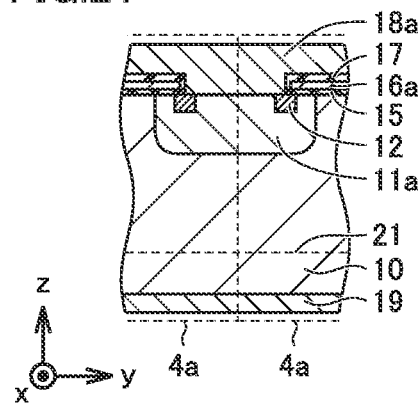
FIG. 21 is a schematic partially enlarged section view along section line XXI-XXI shown in FIG. 19 of the semiconductor device according to the fifth embodiment.
Figure 22:
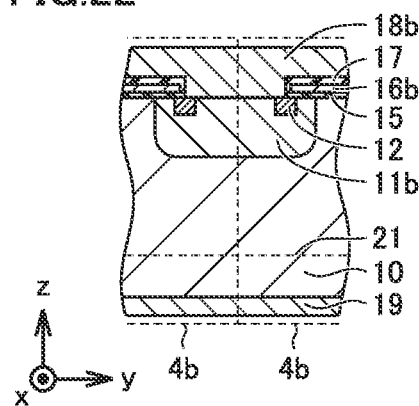
FIG. 22 is a schematic partially enlarged section view along section line XXII-XXII shown in FIG. 19 of the semiconductor device according to the fifth embodiment.
Figure 23:
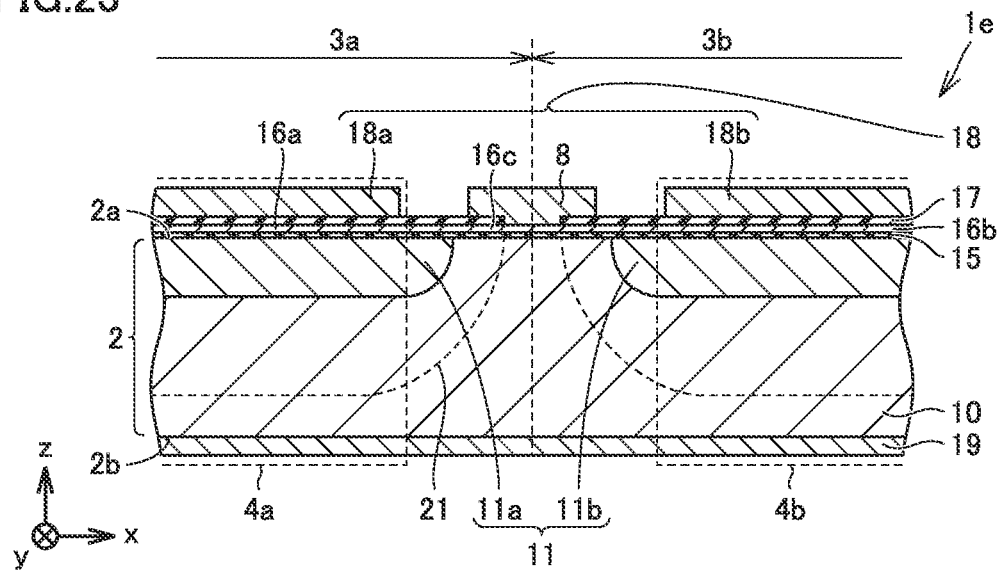
FIG. 23 is a schematic partially enlarged section view along section line XXIII-XXIII shown in FIG. 19 of the semiconductor device according to the fifth embodiment.
Figure 24:
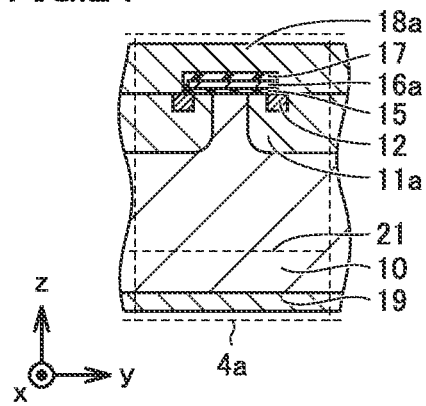
FIG. 24 is a schematic partially enlarged section view along section line XXIV-XXIV shown in FIG. 19 of the semiconductor device according to the fifth embodiment.
Figure 25:
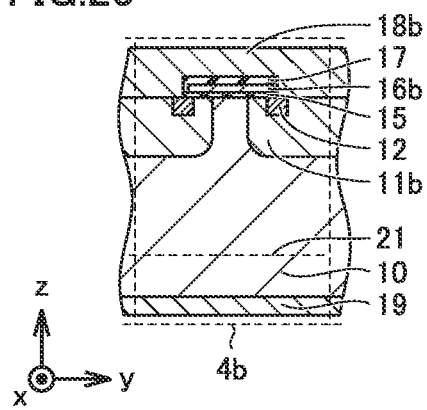
FIG. 25 is a schematic partially enlarged section view along section line XXV-XXV shown in FIG. 19 of the semiconductor device according to the fifth embodiment.

Referring to FIGS. 17 and 18, a semiconductor device 1d of a fourth embodiment is described. Semiconductor device 1d of the present embodiment has the same configuration and exerts the same effect as semiconductor device 1 of the first embodiment, but differs from semiconductor device 1 in the following points.

In semiconductor device 1d, first semiconductor element 4a, second semiconductor element 4b, and third semiconductor element 4c (not shown) are transistors having planar gate structure. Specifically, gate insulating film 15 is disposed on front face 2a of semiconductor substrate 2. A gate electrode 16 is disposed on front face 2a of semiconductor substrate 2 with gate insulating film 15 interposed therebetween, and is a planar gate electrode. First semiconductor element 4a, second semiconductor element 4b, and third semiconductor element 4c are, for example, planar gate MOSFETs. First semiconductor element 4a, second semiconductor element 4b, and third semiconductor element 4c may be planar gate IGBTs.

In a modified example of the present embodiment, semiconductor device 1d may further contain $n^+$ region 30 as in the second embodiment.

Fifth Embodiment

Referring to FIGS. 19 to 25, a semiconductor device 1e of a fifth embodiment is described. Semiconductor device 1e of the present embodiment has the same configuration as semiconductor device 1c of the third embodiment, but differs from semiconductor device 1 in the following points.

Likewise semiconductor device 1d of the fourth embodiment, first semiconductor element 4a, second semiconductor element 4b, and third semiconductor element 4c (not shown) are transistors having planar gate structure, in semiconductor device 1e. Semiconductor device 1e of the present embodiment exerts the effects of the third embodiment and the fourth embodiment.

Sixth Embodiment

Figure 26:
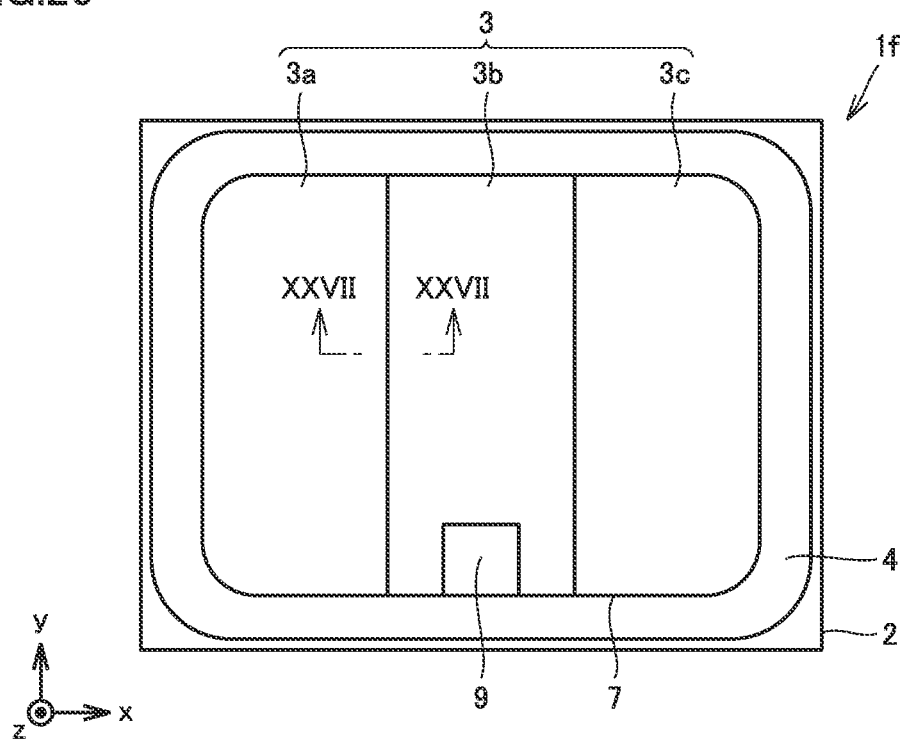
FIG. 26 is a schematic plan view of a semiconductor device according to a sixth embodiment.
Figure 27:
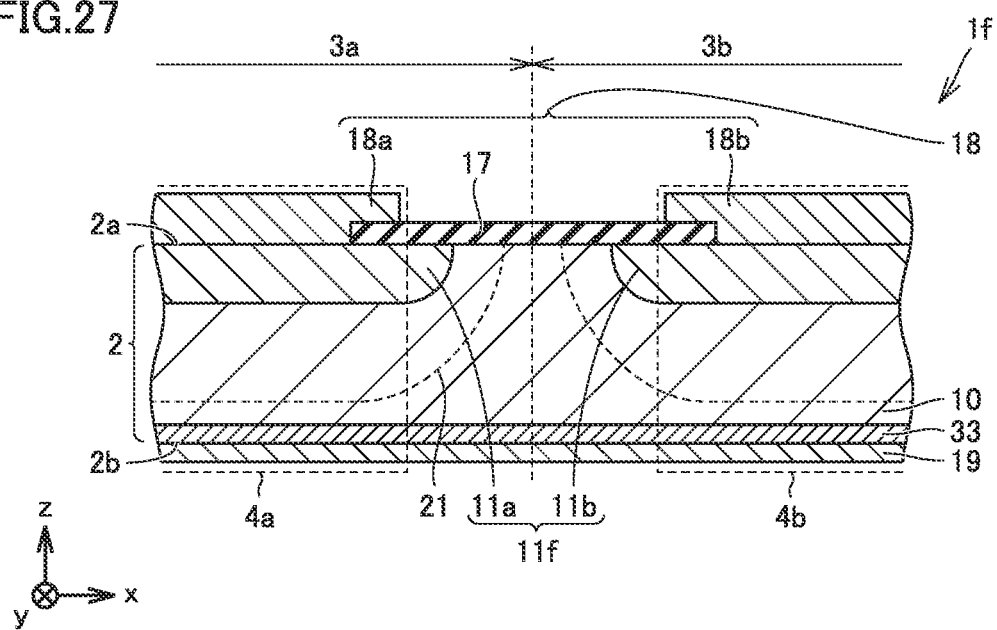
FIG. 27 is a schematic partially enlarged section view along section line XXVII-XXVII shown in FIG. 26 of the semiconductor device according to the sixth embodiment.

Referring to FIGS. 26 and 27, a semiconductor device 1f of a sixth embodiment is described. Semiconductor device 1f of the present embodiment has the same configuration and exerts the same effect as semiconductor device 1d of the fourth embodiment, but differs from semiconductor device 1d in the following points.

In semiconductor device 1f, first semiconductor element 4a, second semiconductor element 4b, and third semiconductor element 4c (not shown) are diodes. Semiconductor device 1f does not include a gate electrode (for example, first gate electrode 16a and second gate electrode 16b), gate insulating film 15, and $n^+$ source region 12.

Specifically, semiconductor substrate 2 includes $n^-$ region 10, first p region 11a, second p region 11b, and an n region 33. First p region 11a and second p region 11b function, for example, as a p-anode region. First electrode 18a functions, for example, as a first anode electrode electrically connected with first p region 11a. Second electrode 18b functions, for example, as a second anode electrode electrically connected with second p region 11b. $N^-$ region 10 functions as an i-type semiconductor region.

N region 33 is disposed on a side of back face 2b of semiconductor substrate 2 with respect to n⁻ region 10. N region 33 is formed continuously throughout a plurality of cell regions (for example, first cell region 3a and second cell region 3b). N region 33 has higher n-type impurity concentration than n⁻ region 10. N region 33 functions as an n-cathode region. Back electrode 19 functions, for example, as an anode electrode. Back electrode 19 is, for example, in contact with n region 33.

In a modified example of the present embodiment, semiconductor device 1f may further contain n⁺ region 30 as in the second embodiment.

It is to be understood that the first to sixth embodiments disclosed herein are illustrative, but are not restrictive in every respect. Unless a contradiction arises, at least two of the first to sixth embodiments disclosed herein may be combined. The scope of the present disclosure is indicated by the appended claims rather than by the foregoing description, and is intended to include all modifications within the equivalent meaning and scope of the claims.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A semiconductor device comprising:
    a semiconductor substrate having a front face, a back face, and an n– region between the front face and the back face;
    a front electrode disposed on the front face; and
    a back electrode disposed on the back face,
    the semiconductor substrate including a first cell region, and a second cell region adjacent to the first cell region,
    the first cell region being formed with a first semiconductor element,
    the second cell region being formed with a second semiconductor element,
    the front electrode including a first electrode formed in the first cell region, and a second electrode formed in the second cell region,
    the first semiconductor element including the first electrode, and a first p region formed on a side of the front face of the first cell region,
    the second semiconductor element including the second electrode, and a second p region formed on a side of the front face of the second cell region,
    the n– region being positioned between the first p region and the second p region,
    the first electrode and the second electrode being separated from each other,
    the first p region and the second p region being separated from each other, and being located inside the n– region.

2. The semiconductor device according to claim 1, wherein the first semiconductor element is a first transistor having trench gate structure, and the second semiconductor element is a second transistor having trench gate structure.

3. The semiconductor device according to claim 1, wherein the first semiconductor element is a first transistor having planar gate structure, and the second semiconductor element is a second transistor having planar gate structure.

4. The semiconductor device according to claim 2, further comprising:
    a gate wiring electrically connected with a first gate electrode of the first semiconductor element, and a second gate electrode of the second semiconductor element,
    in plan view of the front face of the semiconductor substrate, the gate wiring being disposed on a boundary between the first cell region and the second cell region.

5. The semiconductor device according to claim 1, wherein the first semiconductor element is a first diode, and the second semiconductor element is a second diode.

6. The semiconductor device according to claim 1, wherein
    the semiconductor substrate further includes an n+ region disposed between the first p region of the first semiconductor element and the second p region of the second semiconductor element in plan view of the front face of the semiconductor substrate, and
    the n+ region is separated from the first p region and the second p region.

* * * * *